(12) United States Patent
Murayama

(10) Patent No.: US 8,129,830 B2
(45) Date of Patent: Mar. 6, 2012

(54) ELECTRONIC COMPONENT PACKAGE AND METHOD OF MANUFACTURING THE SAME, AND ELECTRONIC COMPONENT DEVICE

(75) Inventor: Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 100 days.

(21) Appl. No.: 12/113,393

(22) Filed: May 1, 2008

(65) Prior Publication Data

US 2008/0315230 A1    Dec. 25, 2008

(30) Foreign Application Priority Data

Jun. 20, 2007   (JP) .................... 2007-163006

(51) Int. Cl.
*H01L 23/10* (2006.01)
(52) U.S. Cl. ............ 257/684; 257/79; 257/99; 257/690; 257/E33.056; 257/E33.057; 257/E33.058
(58) Field of Classification Search .................... 257/79, 257/99, 684, 690, E33.056–E33.058
See application file for complete search history.

(56) References Cited

U.S. PATENT DOCUMENTS

| 6,815,348 | B2 | 11/2004 | Mashino |
| 2006/0220036 | A1* | 10/2006 | Lee et al. ........................ 257/81 |
| 2006/0267210 | A1* | 11/2006 | Yamano et al. ............... 257/774 |
| 2007/0029654 | A1* | 2/2007 | Sunohara et al. ............ 257/678 |
| 2007/0051966 | A1* | 3/2007 | Higashi et al. ................. 257/98 |
| 2007/0111471 | A1* | 5/2007 | Okada .......................... 438/455 |
| 2007/0161316 | A1* | 7/2007 | Taguchi et al. ................ 445/25 |
| 2007/0173165 | A1* | 7/2007 | Taguchi et al. ................ 445/24 |

FOREIGN PATENT DOCUMENTS

| JP | 6-169031 | 6/1994 |
| JP | 2004-22990 A1 | 1/2004 |

* cited by examiner

*Primary Examiner* — Minchul Yang
(74) *Attorney, Agent, or Firm* — Kratz, Quintos & Hanson, LLP

(57) ABSTRACT

An electronic component package, includes a package substrate portion constructed by a silicon substrate in which a through hole is provided, an insulating layer formed on both surface sides of the silicon substrate and an inner surface of the through hole, and a through electrode filled in the through hole, and a frame portion provided upright on a peripheral portion of the package substrate portion to constitute a cavity on the silicon substrate, wherein an upper surface of the through electrode in the cavity is planarized such that a height of the through electrode is set equal to a height of the insulating layer. The frame portion is joined to the package substrate portion by the low-temperature joining utilizing the plasma process after the through electrode is planarized.

10 Claims, 13 Drawing Sheets

(plan view)

US 8,129,830 B2

ELECTRONIC COMPONENT PACKAGE AND METHOD OF MANUFACTURING THE SAME, AND ELECTRONIC COMPONENT DEVICE

CROSS-REFERENCE TO RELATED APPLICATIONS

This application is based on and claims priority of Japanese Patent Application No. 2007-163006 filed on Jun. 20, 2007, the entire contents of which are incorporated herein by reference.

BACKGROUND OF THE INVENTION

1. Field of the Invention

The present invention relates to an electronic component package and a method of manufacturing the same and an electronic component device and, more particularly, an electronic component package on which an electronic component such as an MEMS element, an optical semiconductor element, or the like is mounted and a method of manufacturing the same and an electronic component device.

2. Description of the Related Art

In the prior art, there is the electronic component package on which the electronic component such as the MEMS element, the optical semiconductor element, or the like is mounted. As such electronic component package, some packages have such a structure that a cavity in which the electronic component is mounted is provided in the center portion of a silicon substrate, and through electrodes are provided in a silicon substrate under the cavity.

As an example of a method of manufacturing such electronic component package, as shown in FIG. 1A, first, a first mask layer 200 in which opening portions 200x used to form through holes are provided is formed on a silicon wafer 100. Then, as shown in FIG. 1B, the silicon wafer 100 is etched to pass through from its upper surface to its lower surface by using the first mask layer 200 as a mask, and thus through holes TH are formed. Then, the first mask layer 200 is removed.

Then, as shown in FIG. 1C, a second mask layer 300 in which an opening portion 300x used to form a cavity is provided is formed on the silicon wafer 100. Then, as shown in FIG. 1D, the silicon wafer 100 is etched up to the middle of a thickness by using the second mask layer 300 as a mask, and thus a cavity C is formed. Then, the second mask layer 300 is removed. A plurality of package areas are defined on the silicon wafer 100, and the through holes TH and the cavity C are provided in each area.

Then, as shown in FIG. 1E, an insulating layer 400 made of a silicon oxide layer is formed on the whole surface of the silicon wafer 100 by thermally oxidizing the silicon wafer 100. Then, as shown in FIG. 1F, through electrodes 500 are formed in the through holes TH in the silicon wafer 100 by the plating. At this time, the through electrodes 500 are formed in a state that they protrude from an upper surface and a lower surface of the silicon wafer 100 respectively. Then, as shown in FIG. 1G, individual electronic component packages are obtained by cutting the silicon wafer 100.

As the electronic component package utilizing a silicon as the substrate, in Patent Literature 1 (Patent Application Publication (KOKAI) 2004-22990), it is set forth that a metal is filled in through holes in a silicon substrate, then both surface sides of the silicon substrate are planarized by the polishing, and then the silicon substrate is processed by high-pressure annealing, thereby a density and adhesion of the plug metal are improved.

Also, in Patent Literature 2 (Patent Application Publication (KOKAI) Hei 6-169031), it is set forth that an insulating layer made of a relatively soft polymer such as polyimide, and the like is formed on both surfaces of a silicon substrate, then wiring layers are formed thereon, and then an IC chip made of the same material as the silicon substrate is CCB-connected to the wiring layers, thereby a stress applied to connection portions is reduced.

In the above electronic component packages in the prior art, the through electrodes 500 filled in the through holes TH are formed to protrude from a bottom portion of the cavity C, and also their heights are varied on account of the essential characteristic of the plating. Therefore, a coplanarity of the through electrodes 500 on which the electronic component is mounted is not enough. As a result, in some cases a faulty connection is caused in mounting the high-performance electronic component, and such faulty connection becomes a factor of a reduction of yield.

For this reason, the method of improving the coplanarity by planarizing the through electrodes 500 may be considered. However, since the through electrodes 500 are formed after the cavity C is formed, unevenness due to the cavity C exists on the silicon wafer 100. Therefore, it is difficult to planarize the through electrodes 500 in the cavity C by the CMP, or the like. For the same reason, it is extremely difficult to form fine wiring layers connected to the through electrodes 500 on a bottom surface of the cavity C.

Also, in the electronic component package using the silicon substrate, there is a requirement to built in various elements in the silicon substrate. But it is impossible to say that a method of manufacturing such electronic component package has been satisfactorily established.

SUMMARY OF THE INVENTION

It is an object of the present invention to provide an electronic component package capable of obtaining a sufficient coplanarity of through electrodes even when a cavity is provided and also capable of responding easily to the case where various elements are built, in the electronic component package having such a structure that through electrodes are provided in a silicon substrate, and a method of manufacturing the same and an electronic component device.

The present invention relates to electronic component package, which includes a package substrate portion constructed by a silicon substrate in which through hole is provided, an insulating layer formed on both surface sides of the silicon substrate and inner surface of the through hole, and through electrode filled in the through hole; and a frame portion provided upright on a peripheral portion of the package substrate portion to constitute a cavity on the silicon substrate; wherein upper surface of the through electrode in the cavity is planarized such that a height of through electrode is set equal to a height of the insulating layer.

In the electronic component package of the present invention, the through electrodes are formed in the silicon substrate, and then the package substrate portion is obtained by planarizing the through electrodes. Then, the cavity is constructed by providing the frame portion (silicon) on the peripheral portion of the package substrate portion.

In the present invention, the through electrodes are formed in the flat silicon substrate in which the cavity is not provided, and then the frame portion is provided. Therefore, upper and lower surfaces of the through electrodes can be planarized unlike the prior art. As a result, the planarized through electrodes are arranged in the silicon substrate in the cavity. Also, when the plasma process is utilized, the frame portion can be joined to the package substrate portion by the low-temperature joining that does not damage the through electrodes.

As a result, the electronic component package having such a structure that the cavity is provided on the package substrate portion by the frame portion and the through electrodes whose coplanarity is good are provided in the package substrate portion in the cavity can be obtained.

In the preferred mode of the present invention, the frame portion includes a silicon portion, elements formed on a lower surface of the silicon portion, and connection electrodes formed under the elements and connected electrically to the elements, and the connection electrodes of the frame portion are joined to the through electrodes of the package substrate portion.

Accordingly, the electronic component connected to the through electrodes in the cavity is connected electrically to the element which is formed in the frame portion via the through electrodes, or the like. For example, when the electronic component id the LED, the Zener diode is formed as the element. Then, the electronic component device is constructed when the LED in the cavity is embedded in the fluorescent substance or hermetically sealed by the cap member.

Also, the present invention relates to electronic component package, which includes an upper package portion constructed by a first silicon substrate in which through hole is provided, an insulating layer formed on both surface sides of the first silicon substrate and inner surface of the through hole, and through electrode filled in the through hole and planarized such that height of the through electrode is set equal to a height of the insulating layer; and a lower package portion constructed by a second silicon portion, element formed on an upper surface side of the second silicon portion, and connection electrode formed on the element and connected electrically to the element; wherein the upper package portion is stacked and arranged on the lower package portion, and lower surface of the through electrode of the upper package portion is joined to the connection electrode of the lower package portion.

In the electronic component package of the present invention, like the above invention, the through electrodes are formed in the flat first silicon substrate. Therefore, the through electrodes can be easily planarized. Then, the through electrodes in the first silicon substrate are joined to the connection electrodes in the second silicon substrate into which the element is formed.

In the present invention, like the case where the element is formed in the frame portion in the above invention, the element is formed in the member different from the first silicon substrate in which the through electrodes are provided. Then, the through electrodes in the upper package portion are joined to the connection electrodes of the element in the lower package portion by the low-temperature joining using the plasma process.

Unlike the present invention, when the element is formed in the upper silicon substrate in which the through electrodes are provided, the characteristic of the element deviates on account of the heat treatment as the later step (particularly when the insulating layer is formed by the thermal oxidation), or it is necessary to protect the element. As a result, the design or the process becomes complicated.

In the present invention, the element is not formed in the upper package portion in which the through electrodes are provided, but the element is provided in the lower package portion and then the through electrodes are joined to the connection electrodes of the element by the low-temperature joining using the plasma process.

Therefore, in the present invention, there is no need to consider the deviation of the characteristic of the element, and also there is no need to protect the element. As a result, the electronic component package in which various elements are built can be manufactured with good yield at a low cost.

As explained above, in the electronic component package of the present invention, a sufficient coplanarity of through electrodes can be obtained even when a cavity is provided, and also this package can respond easily to the case where various elements are built in.

DETAILED DESCRIPTION OF THE PREFERRED EMBODIMENTS

Embodiments of the present invention will be explained with reference to the accompanying drawings hereinafter.

First Embodiment

Figure 1A:
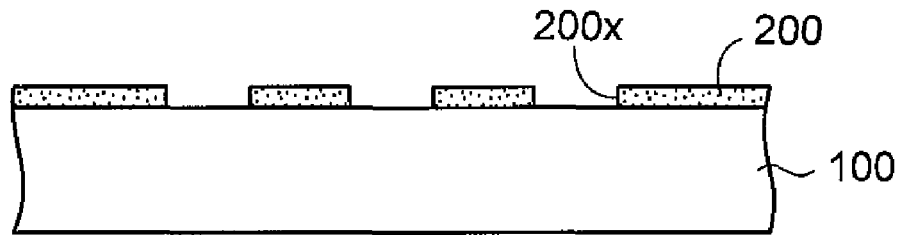
FIGS. 1A to 1G are sectional views showing a method of manufacturing an electronic component package in the prior art.
Figure 1B:
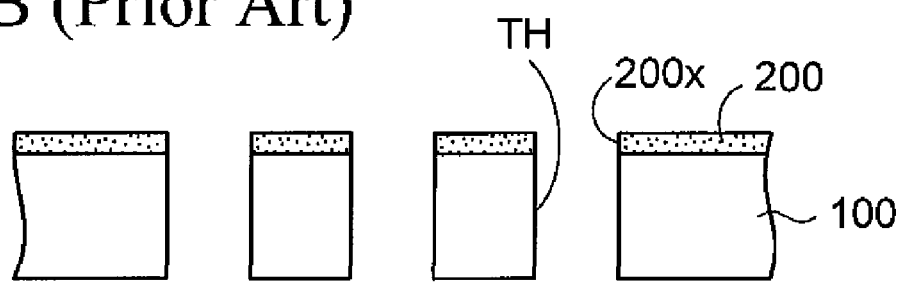
Figure 1C:
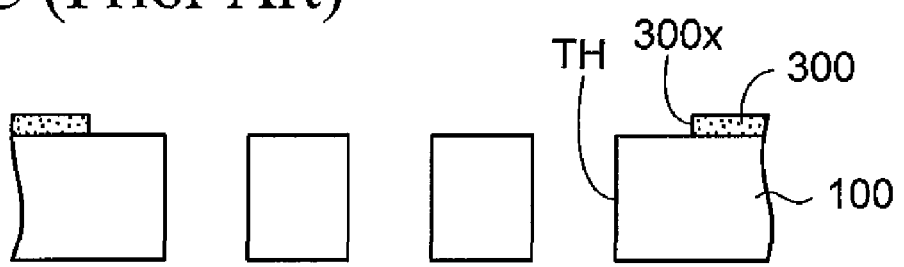
Figure 1D:
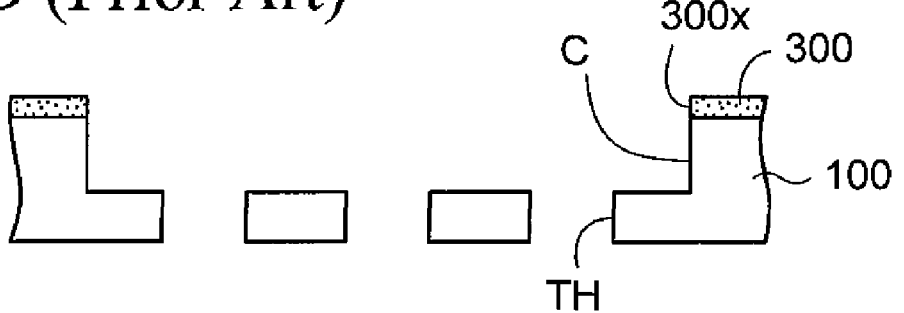
Figure 1E:
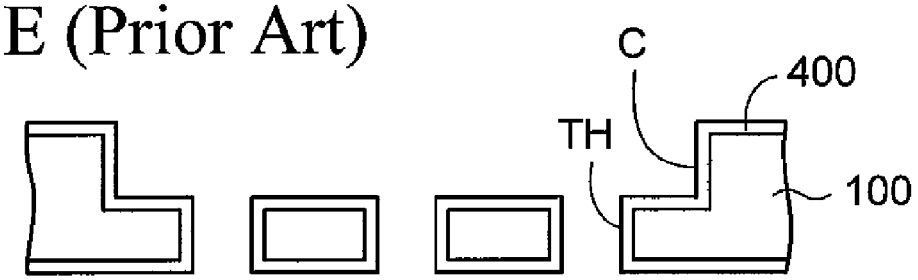
Figure 1F:
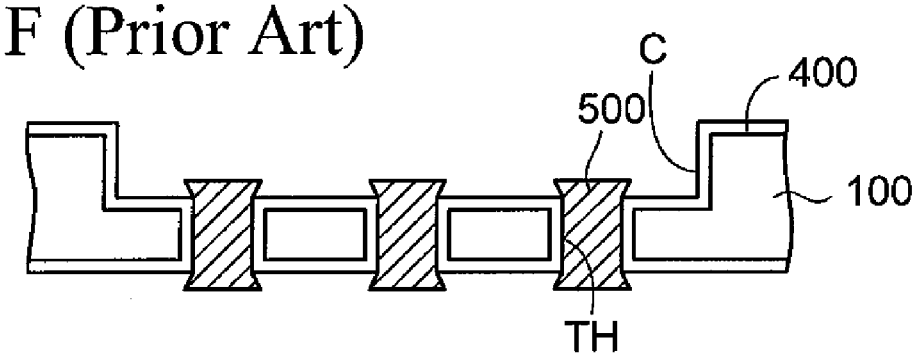
Figure 1G:
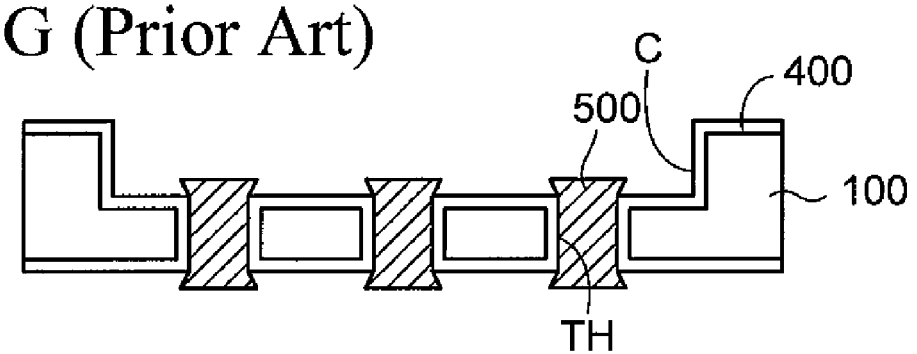
Figure 2A:
FIGS. 2A to 2M are sectional views showing a method of manufacturing an electronic component package of a first embodiment of the present invention.
Figure 2B:
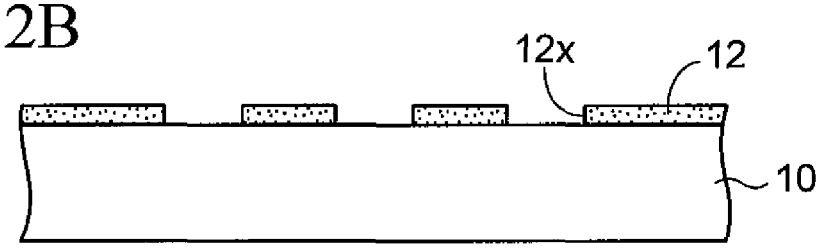
Figure 2C:
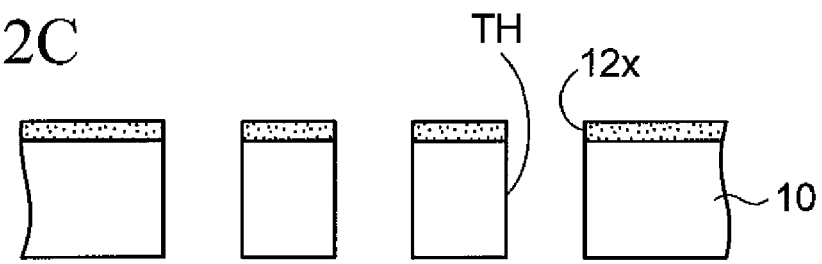
Figure 2D:
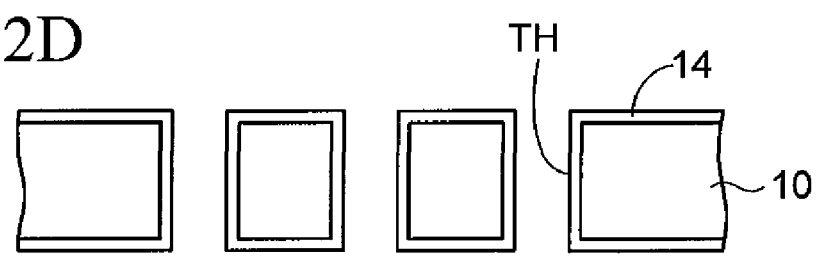
Figure 2E:
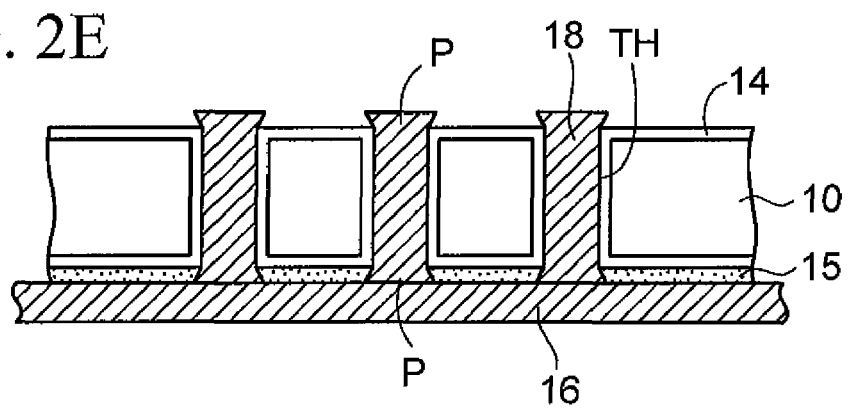
Figure 2F:
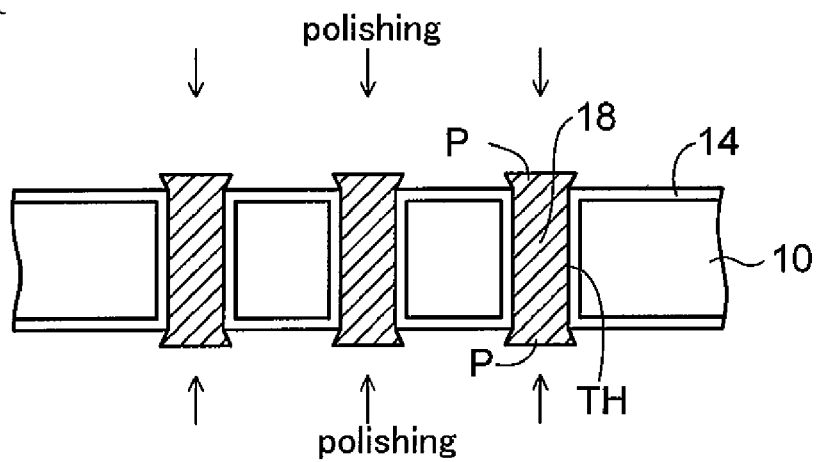
Figure 2G:
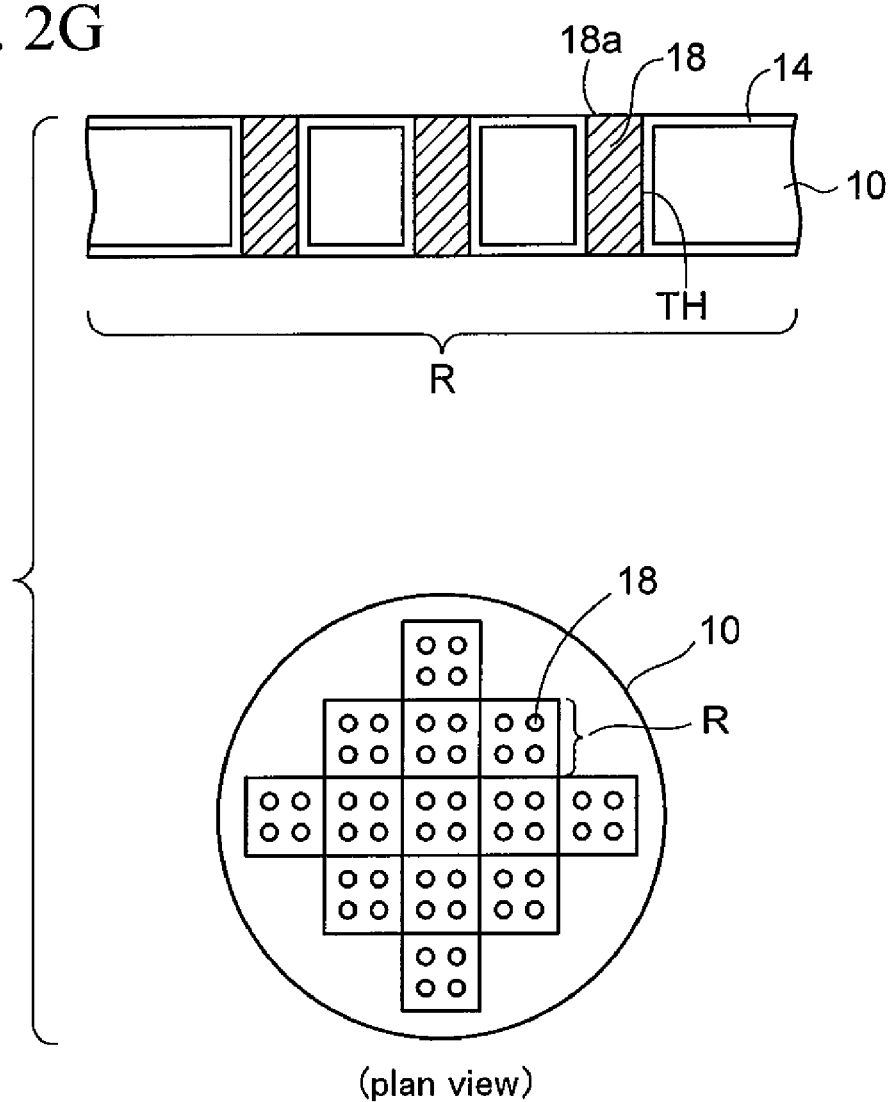
Figure 2H:
Figure 2I:
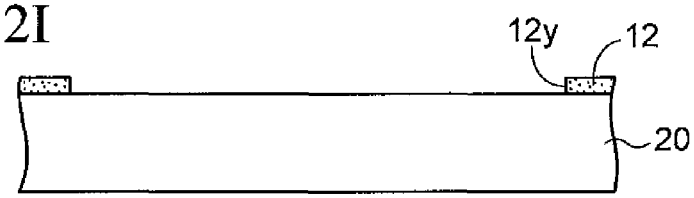
Figure 2J:
Figure 2K:
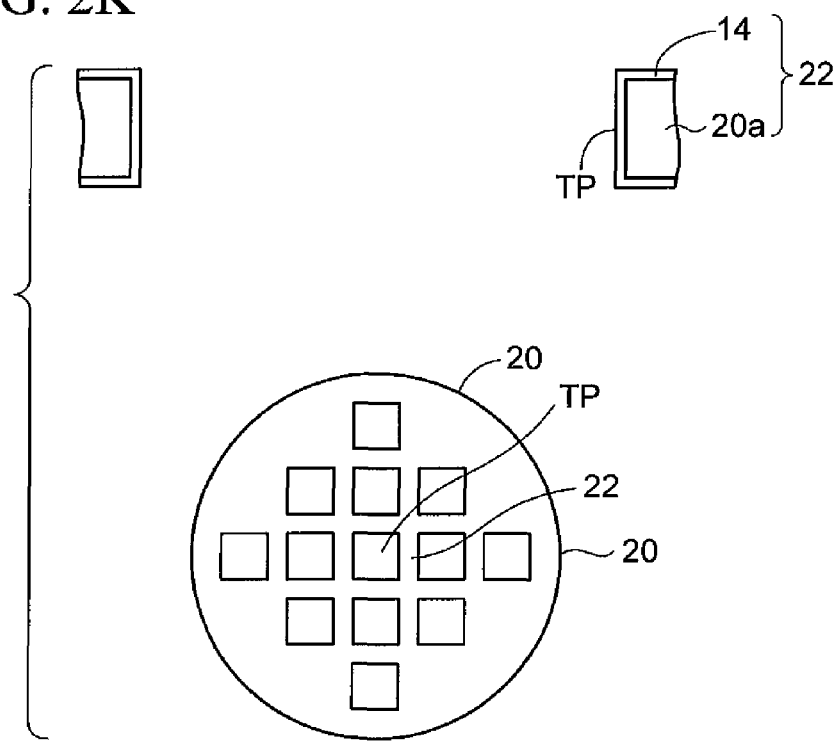
Figure 2L:
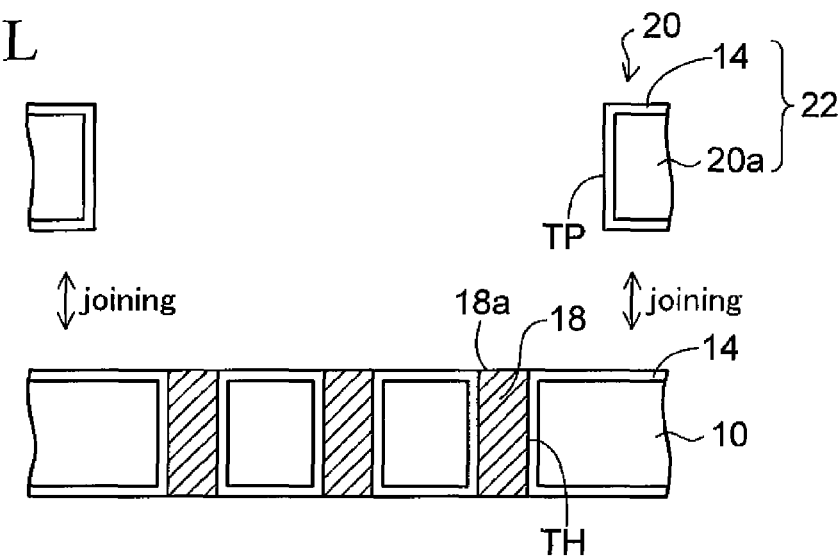
Figure 2M:
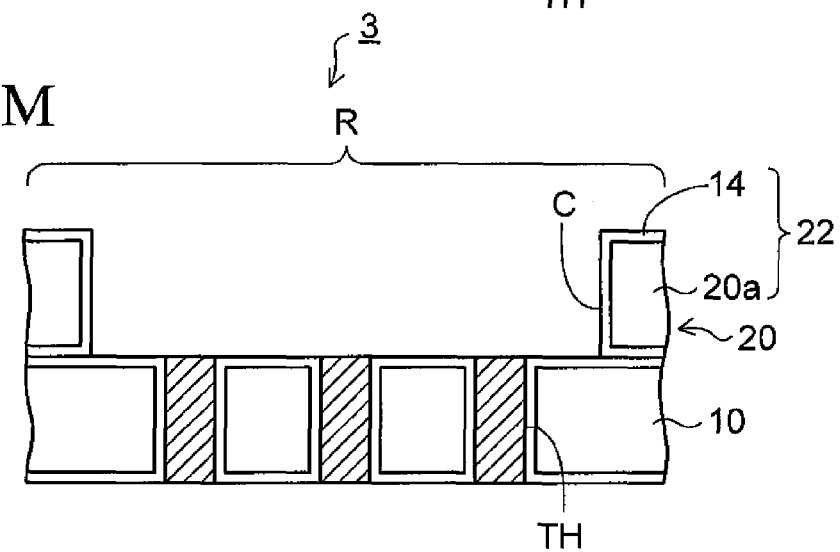
Figure 3:
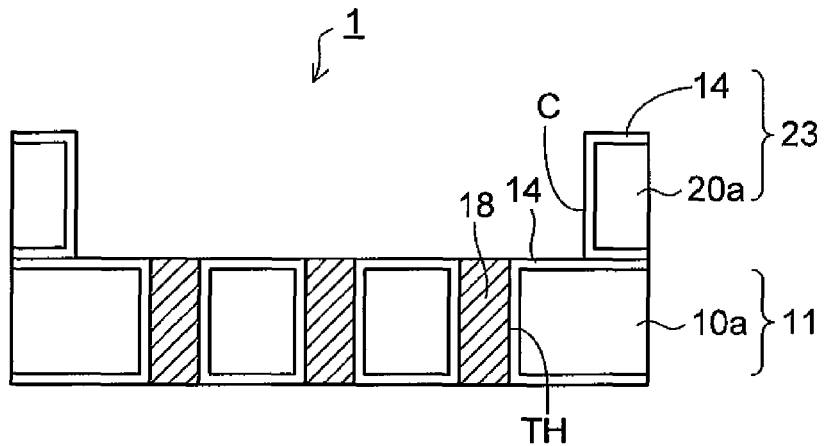
FIG. 3 is a sectional view showing the electronic component package of the first embodiment of the present invention.
Figure 4:
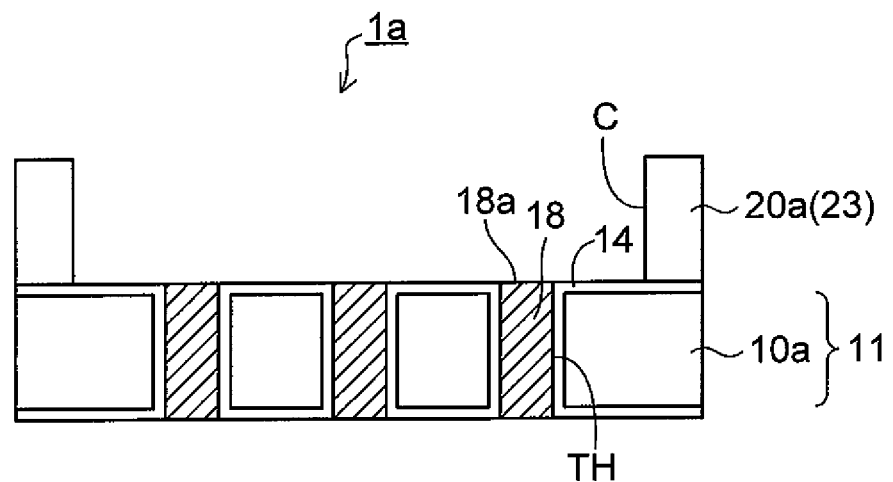
FIG. 4 is a sectional view showing an electronic component package of a variation of the first embodiment of the present invention.
Figure 5:
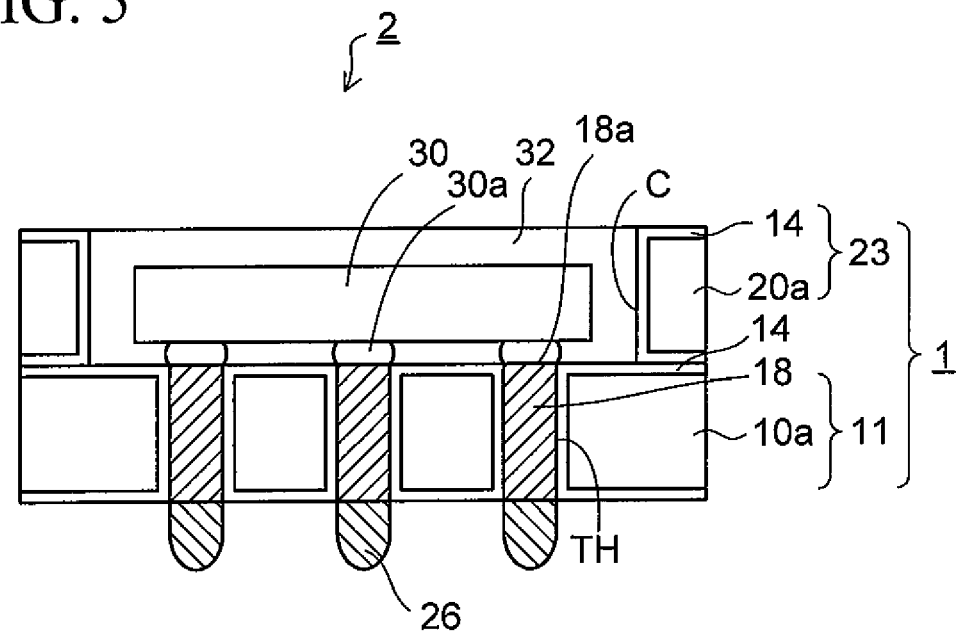
FIG. 5 is a sectional view showing a first electronic component device of the first embodiment of the present invention.
Figure 6:
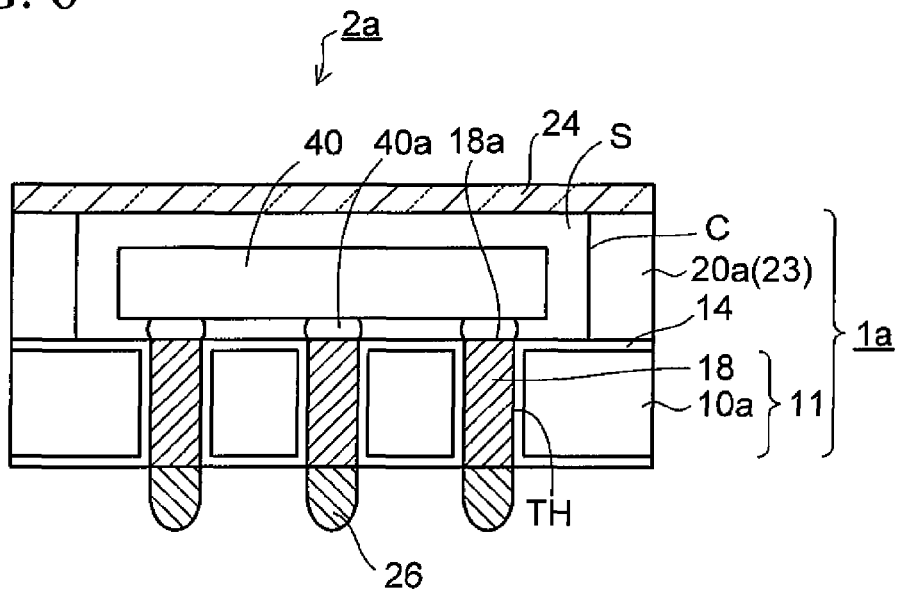
FIG. 6 is a sectional view showing a second electronic component device of the first embodiment of the present invention.
Figure 7:
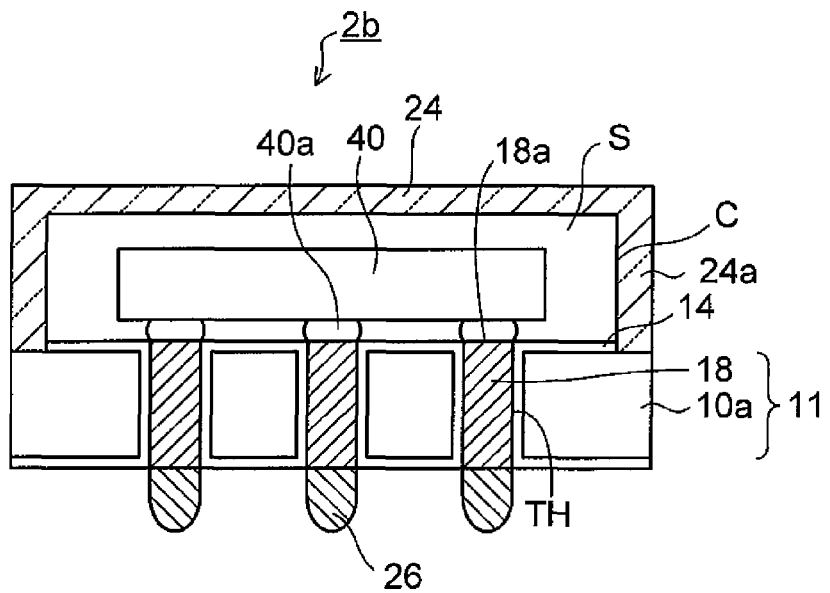
FIG. 7 is a sectional view showing a third electronic component device of the first embodiment of the present invention.

FIGS. 2A to 2M are sectional views showing a method of manufacturing an electronic component package of a first embodiment of the present invention, FIG. 3 and FIG. 4 are sectional views showing the electronic component package of the same respectively, and FIG. 5 to FIG. 7 are sectional views showing an electronic component device of the same respectively.

In the method of manufacturing the electronic component package of the first embodiment, as shown in FIG. 2A, first, a first silicon wafer 10 of a 600 to 800 μm thickness is prepared as a silicon substrate. One or plural package regions are defined on the first silicon wafer 10 to obtain individual packages.

Then, as shown in FIG. 2B, a mask layer 12 in which opening portions 12x to form the through holes are provided is formed on the first silicon wafer 10. As the mask layer 12, the resist may be patterned in a single layer. Alternately, the mask layer 12 may be formed by patterning a resist on a hard mask layer such as a silicon oxide layer, or the like, and then etching the hard mask layer using the resist as a mask.

Then, as shown in FIG. 2C, through holes TH are formed by etching the first silicon wafer 10 through the opening portions 12x while using the mask layer 12 as a mask, to pass through from an upper surface to a lower surface. The through holes TH are formed in the package regions of the first silicon wafer 10 respectively. Then, the mask layer 12 is removed.

Then, as shown in FIG. 2D, an insulating layer 14 made of a silicon oxide layer and having a film thickness of about 500 nm is formed on both surfaces of the first silicon wafer 10 and inner surfaces of the through holes TH, by thermally oxidizing the first silicon wafer 10. In this case, a silicon oxide layer formed on the all surfaces of the first silicon wafer 10 by the CVD method may be used as the insulating layer 14.

Then, as shown in FIG. 2E, the first silicon wafer 10 is arranged on a plating power feeding member 16 such as a copper foil, or the like via an adhesive layer 15. Openings are provided in portions, which correspond to the through holes TH in the first silicon wafer 10, of the adhesive layer 15. Also, a metal (a copper, or the like) is filled from a lower portion to an upper portion of the through hole TH by the electroplating utilizing the plating power feeding member 16 as a plating power feeding path, and thus through electrodes 18 are formed. Then, the plating power feeding member 16 and the adhesive layer 15 are removed from the first silicon wafer 10.

At this time, because of the characteristic of the electroplating, it is difficult to control the electroplating such that upper surfaces of the through electrodes 18 constitute a coplanar surface with the upper surface side of the first silicon wafer 10. Therefore, the through electrodes 18 are formed in a state that projection portions P protrude upward from the upper surface of the insulating layer 14 on the first silicon wafer 10. In addition, heights of the projection portions P of the through electrodes 18 are varied due to an in-plane variation of the electroplating. Similarly, on the lower surface side of the first silicon wafer 10, the through electrodes 18 are formed in a state that the projection portions P protrude downward.

Then, as shown in FIG. 2F, the projection portions P of the through electrodes 18 on both surface sides of the first silicon wafer 10 are polished by the CMP (Chemical Mechanical Polishing), or the like respectively. Thus, as shown in FIG. 2G, the upper surfaces of the through electrodes 18 are made equal in height to the insulating layer 14 on both surface sides of the first silicon wafer 10, so that the whole surface is planarized. That is, the upper surfaces and the lower surfaces of the through electrodes 18 and the surfaces of the insulating layer 14 on both surface sides constitute an identical surface respectively and they are planarized. An upper surface of through electrode 10 constitutes a connection portion 18a.

With the above, as shown in a plan view in FIG. 2G, when multiple productions are obtain from the first silicon wafer 10, a plurality of package regions R are provided to the first silicon wafer 10 and the through electrodes 18 are formed in each region respectively.

In the present embodiment, the through electrodes 18 are formed in the first silicon wafer 10 to which no cavity is provided and which is flat over the whole area. Therefore, unlike the prior art, the through electrodes 18 can be easily planarized. As a result, the coplanarity of connection portions 18a of the through electrodes 18 can be improved, and the electronic component can be mounted with good reliability.

Next, a method of providing the cavity on respective package regions R of the first silicon wafer 10 will be explained hereunder. First, as shown in FIG. 2H, a second silicon wafer 20 similar to the first silicon wafer 10 is prepared. Then, as shown in FIG. 2I, the mask layer 12 in which an opening portion 12y is provided in a portion, which correspond to a center major portion of each package region R of the first silicon wafer 10, is formed on the second silicon wafer 20.

Then, as shown in FIG. 2J, through portions TP are formed by etching the second silicon wafer 20 from an upper surface to a lower surface through the opening portion 12y, while using the mask layer 12 as a mask. Thus, a grid-like frame portion 22 formed of silicon portions 20a that are connected mutually is formed in the second silicon wafer 20. Then, the mask layer 12 is removed.

Then, as shown in FIG. 2K, the insulating layer 14 made of a silicon oxide layer is formed on both surfaces of the second silicon wafer 20 and inner surfaces of the through portions TP by thermally oxidizing the second silicon wafer 20. Thus, the grid-like frame portion 22 is constructed from the silicon portion 20a and the insulating layer 14 for coating the silicon portion 20a. In this case, the grid-like frame portion 22 may be formed only of the silicon portion 20a by omitting the insulating layer 14.

As shown in a plan view of FIG. 2K, the grid-like frame portion 22 provided to the second silicon wafer 20 is formed to correspond to the boundary portion of the package regions R of the first silicon wafer 10 (a plan view of FIG. 2G) respectively. In this manner, the second silicon wafer 20 is processed and becomes the frame member.

Then, as shown in FIG. 2L, the second silicon wafer 20 in which the grid-like frame portion 22 is provided is adhered onto the foregoing first silicon wafer 10 in which the through electrodes 18 are provided in the package regions R in FIG. 2G. To explain in more detail, first, an ultrasonic wave is applied to the first and second silicon wafers 10, for 5 minute in a state that these wafers are dipped in ozone water (ozone concentration: 8 ppm).

Then, the ultrasonic wave is applied to the first and second silicon wafers 10, 20 for 5 minute in a state that these wafers are dipped in water. Then, the first and second silicon wafers 10, 20 are dried by a spin driver. Accordingly, an organic substance, etc. adhered to surfaces of the first and second silicon wafers 10, 20 are removed and rinsed out.

Then, a first plasma process is applied to respective joining surfaces of the first and second silicon wafers 10, 20 by using an oxygen ($O_2$) gas. As an example of the conditions of the first plasma process, a pressure: 55 Pa, a high-frequency power (13.56 MHz): 70 W, and a processing time: 30 second are employed.

Then, a second plasma process is applied to respective joining surfaces of the first and second silicon wafers 10, 20 by using a nitrogen ($N_2$) gas. As an example of the conditions of the second plasma process, a pressure: 20 Pa, a high-frequency power (13.56 MHz): 270 W, and a processing time: 15 second are employed.

As a result, respective joining surfaces of the first and second silicon wafers 10, 20 are hydrophilized, and surface conditions suitable for the joining can be obtained.

Then, the second silicon wafer 20 is aligned with the first silicon wafer 10 and arranged such that the grid-like frame portion 22 of the second silicon wafer 20 corresponds to the boundary portion of respective package regions R of the first silicon wafer 10 (see plan views of FIG. 2G and FIG. 2K).

Then, the first and second silicon wafers 10, being stacked are press-bonded by applying a pressure of 100 N/wafer to both wafers for 5 second. Then, the heat treatment is applied to the first and second silicon wafers 10, 20 at a temperature of 150° C. for 8 hour. Thus, as shown in FIG. 2M, the grid-like frame portion 22 of the second silicon wafer 20 is joined onto the first silicon wafer 10.

Since the through electrodes 18 (copper) provided to the first silicon wafer 10 can withstand sufficiently the heat treatment up to about 400° C., a temperature of the heat treatment can be set freely between 100 to 400° C. That is, by performing the plasma process to the first and second silicon wafers 10, 20, both wafers can be joined at a low temperature at a heatproof temperature or less of the through electrode 18.

Then, the grid-like frame portion 22 of the second silicon wafer 20 is arranged on the boundary portion of respective package regions R of the first silicon wafer 10, thereby the cavity C is provided in the center portions of the package regions R respectively. In this manner, a wafer-like package member 3 having such a structure that the grid-like frame portion 22 is provided upright on the peripheral portions of the package regions R of the first silicon wafer 10 respectively can be obtained.

In the above mode, the grid-like frame portion 22 is made of silicon. In this case, as the material of the grid-like frame portion 22, any material may be employed if such material can be joined to the first silicon wafer 10 by the above-mentioned bonding method.

In the present embodiment, the electronic component may be mounted on the package regions R of the wafer-like package member 3 respectively, and then the electronic component device may be constructed by cutting the first and second silicon wafers 10, 20. Alternately, individual electronic component packages may be obtained by cutting the first and second silicon wafers 10, 20, and then the electronic component device may be constructed by mounting the electronic component.

In FIG. 3, an electronic component package 1 of the present embodiment obtained when the package member 3 in FIG. 2M is cut is shown. As shown in FIG. 3, when the first and second silicon wafers 10, are cut, the first silicon wafer 10 becomes individual silicon substrates 10a, and the grid-like frame portion 22 of the second silicon wafer 20 becomes individual frame portions 23.

As shown in FIG. 3, the electronic component package 1 of the first embodiment is constructed basically by a package substrate portion 11 and the frame portion 23 joined to the peripheral portion thereof to stand upright. In the package substrate portion 11, the through holes TH are provided in the silicon substrate 10a, and the insulating layer 14 is formed on both surface sides of the silicon substrate 10a and the inner surfaces of the through holes TH. The through electrodes 18 are provided in the through holes TH, and upper surfaces and lower surfaces of the through electrodes 18 are planarized at the same height as the surfaces of the insulating layer 14 on both surface sides of the silicon substrate 10a respectively.

The frame portion 23 is constructed by coating the upper surface and the lower surface and the inner surface sides of the silicon portion 20a with the insulating layer 14. Then, the insulating layer 14 on the lower surface side of the frame portion 23 is joined to the insulating layer 14 on the upper surface side of the package substrate portion 11. Thus, the cavity C is provided in the center major portion on the package substrate portion 11.

As described above, in the method of manufacturing the electronic component package 1 of the first embodiment, the through electrodes 18 are formed on the first silicon wafer 10, in which the cavity C is not provided and which is made flat, via the insulating layer 14, and then the projection portions P of the through electrodes 18 are planarized by the polishing. Then, the second silicon wafer 20 in which the grid-like frame portion 22 is provided is joined onto the first silicon wafer 10. Thus, the cavity C is provided in the package regions R of the first silicon wafer 10 respectively.

The joining of the first silicon wafer 10 and the second silicon wafer 20 is carried out by rinsing out respective joining surfaces, applying the plasma process them, aligning them with each other and press-bonding them, and applying the heat treatment to them at the low temperature side (150° C.).

In the prior art, the technology to adhere the silicon wafers mutually by the thermo compression bonding at a considerably high temperature of about 1000° C. has been known. However, in the present embodiment, since the through electrodes 18 (copper, or the like) are provided in the first silicon wafer 10, the through electrodes 18 cannot withstand such high-temperature process.

The method of joining the silicon wafers of the present embodiment has been made in view of such problem. By utilizing the plasma process, the second silicon wafer 20 can be joined onto the first silicon wafer 10 by the low temperature process (e.g., 150° C.), which does not damage the through electrodes 18, even in a situation that the through electrodes 18 are provided in the first silicon wafer 10.

When such manufacturing method is employed, the electronic component package 1 having such a structure that the cavity C is provided on the package substrate portion 11 by the frame portion 23 and also the through electrodes 18 whose coplanarity is good are provided on the package substrate portion 11 in the cavity C can be manufactured easily.

In this case, like an electronic component package 1a of a variation shown in FIG. 4, the insulating layer 14 is omitted from the frame portion 23 of the electronic component package 1 in FIG. 3 may be omitted, and then the cavity C may be constructed by joining the frame portion 23 consisting only of the silicon portion 20a onto the package substrate portion 11. In the case of this mode, in the above step in FIG. 2L, the second silicon wafer 20 on which the frame portion 23 consisting only of the silicon portion 20a is provided is joined onto the first silicon wafer 10 by the similar joining method.

Next, an electronic component device constructed by utilizing the electronic component package 1 of the present embodiment will be explained hereunder. As shown in FIG. 5, in a first electronic component device 2 of the present embodiment, bumps 30a of an LED (Light Emitting Diode) 30 are flip-chip connected to the connection portions 18a of the through electrodes 18 in the cavity C of the electronic component package 1 in FIG. 3. Thus, the LED 30 is housed in the cavity C.

Also, a fluorescent substance 32 is filled in the cavity C, and the LED 30 is embedded in the fluorescent substance 32. Also, external connection terminals 26 are provided by mounting solder balls, or the like under the through electrodes 18.

By mounting the LED 30 in the cavity C of the electronic component package 1, the fluorescent substance 32 having a uniform film thickness can be formed easily on the upper surface (light emitting surface) side of the LED 30. The LED 30 emits a blue or purple light, for example, and a white light is emitted to the outside by the action of the fluorescent substance 32. In this case, in FIG. 5, a transparent cap member may also be provided on the fluorescent substance 32.

In FIG. 6, a second electronic component device 2a of the first embodiment is shown. As shown in FIG. 6, bumps 40a of an electronic component 40 are flip-chip connected to the connection portions 18a of the through electrodes 18 in the cavity C of the electronic component package 1a (FIG. 4) according to the above variation. As the electronic component 40, the optical semiconductor element such as LED, or the like, or the MEMS element such as an accelerator sensor, or the like is used.

Also, a cap member 24 is joined onto the frame portion 23 of the electronic component package 1a. A housing portion S is constructed by the package substrate portion 11 and the frame portion 23, and the electronic component 40 is housed in this housing portion S in a hermetically sealed manner. Also, the external connection terminals 26 are provided by mounting the solder ball, or the like under the through electrodes 18.

In FIG. 6, such a mode is illustrated that the electronic component 40 is formed of the optical semiconductor element. The cap member 24 is formed of a transparent glass cap, and the glass cap is joined to the frame portion 23 (the silicon portion 20a) of the electronic component package 1a by the anode connecting. Also, the optical semiconductor element emits a light to the outside via the glass cap or receives a light from the outside.

In this case, when the electronic component package 1 in FIG. 3 is employed and the insulating layer 14 on the upper surface of the frame portion 23 is removed partially to expose the silicon portion 20a, the glass cap can be anode-connected to the frame portion 23.

Alternately, when the electronic component 40 is formed of the MEMS element, the cap member 24 is formed of an opaque material such as a silicon cap in addition to the glass cap. The silicon cap is joined to the frame portion 23 of the electronic component package 1a by the joining method utilizing the above-mentioned plasma process. In this case, when the silicon cap is employed, the electronic component package 1 having the frame portion 23 whose surface is coated with the insulating layer 14, as shown in FIG. 3, may be employed.

Also, in FIG. 7, a third electronic component device 2b of the first embodiment is shown. As shown in FIG. 7, in the third electronic component device 2b, the frame portion 23 in the electronic component package 1 in FIG. 3 is omitted. Then, the bumps 40a of the electronic component 40 are flip-chip connected to the connection portions 18a of the through electrodes 18 of the package substrate portion 11. Also, the cap member 24 having such a structure that the cavity C (the recess portion) is provided in the center portion and a projection-like bonding portion 24a is provided in the peripheral portion, is arranged on the package substrate portion 11 such that the cavity C is directed downward. A top end surface of the projection-like bonding portion 24a of the cap member 24 is adhered onto the package substrate portion 11.

The housing portion S is constructed by the cavity C of the cap member 24, and the electronic component 40 is housed in the housing portion S in a hermetically sealed condition. In FIG. 7, a mode in which the electronic component 40 is formed of the optical semiconductor element is illustrated. The cap member 24 is formed of the transparent glass cap, the insulating layer 14 on the peripheral portion of the package substrate portion 11 is partially removed, and the glass cap is anode-connected to the exposed silicon substrate 10.

Alternately, when the MEMS element is employed as the electronic component 40, the cap member 24 may be formed of the opaque material such as a silicon cap, or the like in addition to the glass cap. In such case, the joining portion of the package substrate portion 11 may be coated with the insulating layer 14.

In the first to third electronic component devices 2, 2a, 2b of the present embodiment, the package substrate portion 11 is formed by processing the first silicon wafer 10 that can be processed with high precision. Therefore, the through electrodes 18 can be easily formed at a narrow pitch. Also, the cavity is not formed into the first silicon wafer 10, but the cavity C (housing portion) is constructed by the frame portion 23 and the cap member 24.

Accordingly, the first silicon wafer 10 is made flat over the whole surface. Therefore, the through electrodes 18 can be easily planarized, and the coplanarity of the connection portion 18a can be set in a good condition. As a result, the high-performance electronic component having a large number of terminals at a narrow pitch can be mounted with good reliability.

In addition, although not shown, fine wiring pattern layers connected to the through electrodes 18 can be formed after the through electrodes 18 are planarized (after the step in FIG. 2G). As a result, the electronic component package of the present embodiment can respond to the mounting of various electronic components, and a margin of design can be widened.

Second Embodiment

Figure 8A:
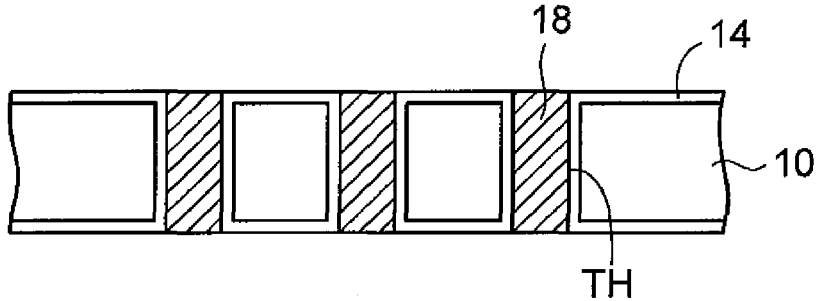
FIGS. 8A to 8F are sectional views showing a method of manufacturing an electronic component package of a second embodiment of the present invention.
Figure 8B:
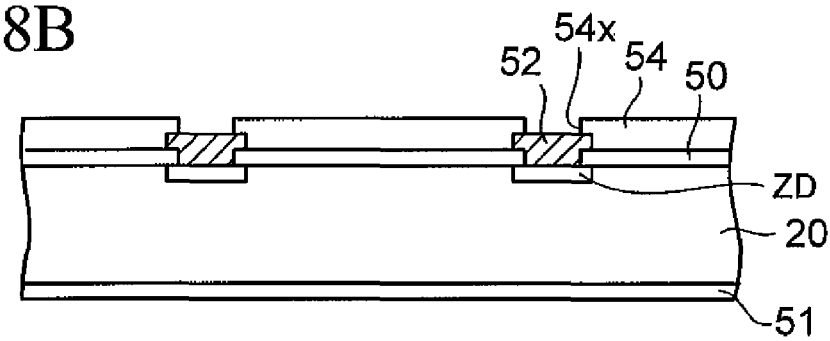
Figure 8C:
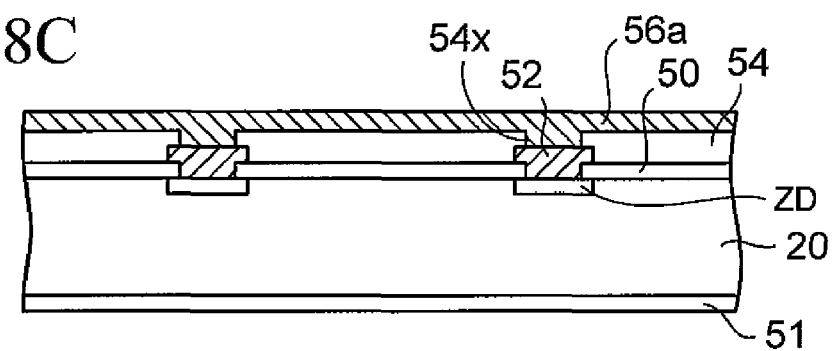
Figure 8D:
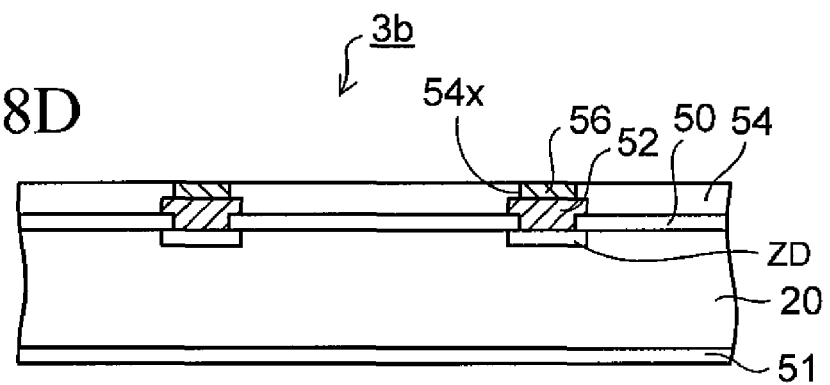
Figure 8E:
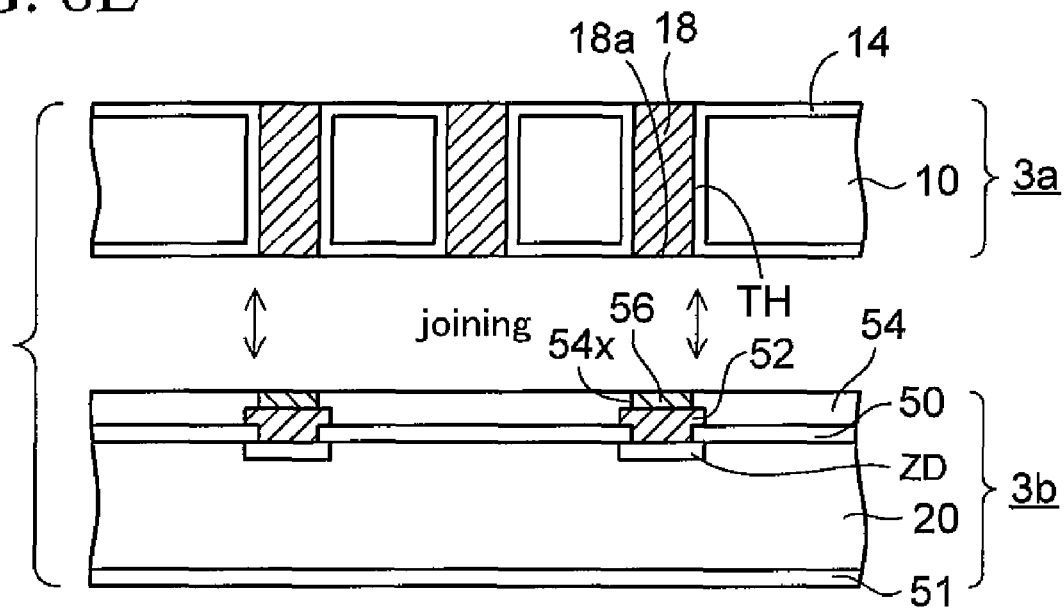
Figure 8F:
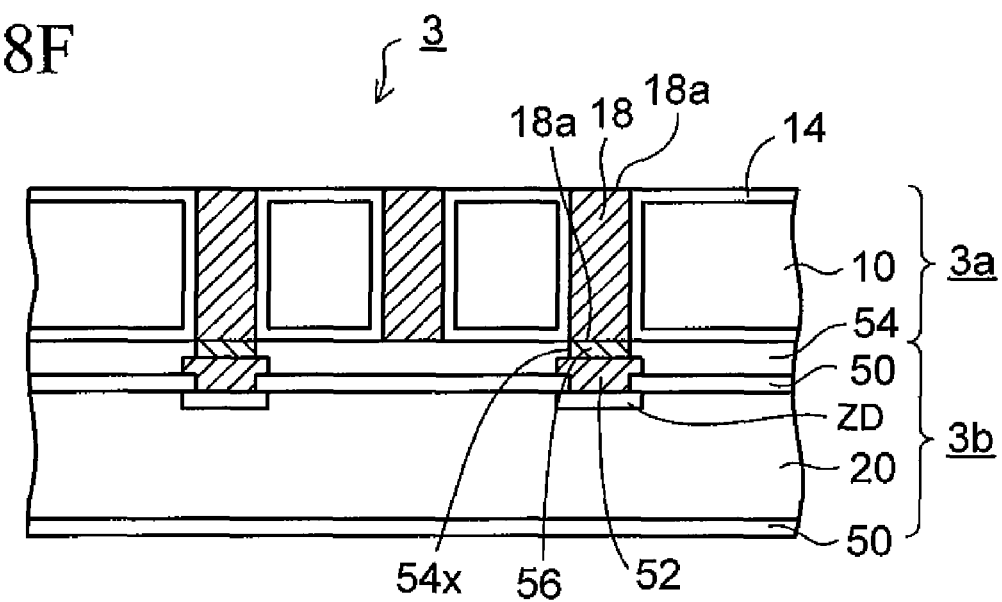
Figure 9:
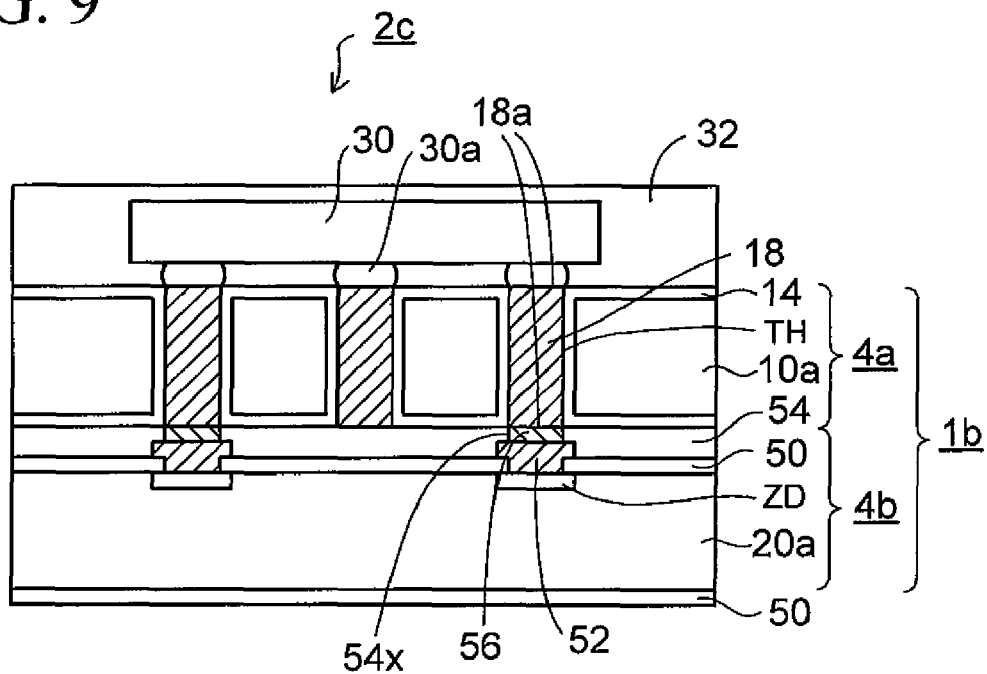
FIG. 9 is a sectional view showing an electronic component device of the second embodiment of the present invention.

FIGS. 8A to 8F are sectional views showing a method of manufacturing an electronic component package of a second embodiment of the present invention, and FIG. 9 is a sectional view showing an electronic component device of the same.

A feature of the second embodiment resides in that elements (diodes, and the like) connected to the electronic component are formed into the silicon substrate constituting the electronic component package. In the second embodiment, detailed explanation about the same elements and the same steps as those in the first embodiment will be omitted.

In the method of manufacturing the electronic component device of the second embodiment, as shown in FIG. 8A, first, the identical structure to the first silicon wafer 10 in FIG. 2G is formed by the similar method to the first embodiment, the structure constitutes an upper package member 3a. More particularly, the through holes TH are formed in the first silicon wafer 10, then the insulating layer 14 is formed on the whole surface, then the through electrodes 18 are formed in the through holes TH, and then both surface sides of the first silicon wafer 10 are planarized.

Then, as shown in FIG. 8B, the second silicon wafer 20 into the upper surface side of which Zener diodes ZD are formed is prepared. The Zener diode ZD is formed by ion-implanting a p-type conductive impurity (a boron, or the like) into the n-type second silicon wafer 20. A first insulating layer 50 in which opening portions are provided on the Zener diodes ZD is formed on the second silicon wafer 20. Also, electrode pads 52 each connected to the Zener diode ZD are formed on the first insulating layer 50. The electrode pad 52 is constructed by forming a Ti (titanium) layer/a TiN (titanium nitride) layer/an Al (aluminum) layer in order from the bottom.

Then, a second insulating layer 54 in which opening portions 54x are provided on the electrode pads 52 is formed on the first insulating layer 50. Also, an insulating layer 51 is formed on the lower surface of the second silicon wafer 20.

Then, as shown in FIG. 8C, a metal layer 56a is obtained by forming a Ti layer/a Cu (copper) layer sequentially from the bottom on the second insulating layer 54 and the electrode pads 52 by the sputter method. Then, the metal layer 56a is polished by the CMP, or the like until the second insulating layer 54 is exposed. Accordingly, as shown in FIG. 8D, the metal layer 56a is embedded in the opening portions 54x in the second insulating layer 54, and thus connection electrodes 56 connected to the electrode pads 52 are obtained. In this manner, the connection electrodes 56 connected electrically to the Zener diode ZD respectively are provided on the upper surface side of the second silicon wafer 20 in their exposed state. Then, the second silicon wafer 20 in FIG. 8D constitutes a lower package member 3b.

Then, as shown in FIG. 8E, the lower connection portion 18a (the copper layer) of the through electrode 18 in the upper package member 3a in FIG. 8A above mentioned are joined to the connection electrodes 56 (the copper layer) of the lower package member 3b in FIG. 8D. As this joining method, the similar method to the step in FIG. 2L in the first embodiment is employed. In other words, respective joining surfaces of the upper package member 3a and the lower package member 3b are rinsed out, then the plasma process is applied to the upper and lower package member 3a, 3b, then the upper and lower package member 3a, 3b are aligned with each other and then press-bonded, and then the heat treatment is applied to the upper and lower package member 3a, 3b at a temperature of 150° C.

The method of joining with the lower temperature side by utilizing the plasma process can be applied not only to join the silicon and the silicon, the silicon and the silicon oxide layer (the insulating layer), or the silicon oxide layer and the silicon oxide layer (the insulating layer) but also to join various metal materials such as the copper and the copper, and the like.

Accordingly, as shown in FIG. 8F, the connection electrodes 56 of the lower package member 3b and the connection portions 18a of the through electrodes 18 of the upper package member 3a are joined and connected electrically mutually.

That is, the Zener diodes ZD provided to the lower package member 3b are connected electrically to the through electrodes 18 of the upper package member 3a via the electrode pads 52 and the connection electrodes 56.

With the above, the package member 3 of the second embodiment that is constructed by stacking the upper package member 3a on the lower package member 3b is obtained.

In the second embodiment, the electronic component may be mounted on the package regions of the wafer-like package member 3 respectively, and then individual electronic component devices may be constructed by cutting the package member 3. Alternately, individual electronic component packages may be obtained by cutting the package member 3, and then the electronic component device may be constructed by mounting the electronic component.

In FIG. 9, the electronic component device constructed by using the electronic component package of the second embodiment is shown. As shown in FIG. 9, an electronic component package 1b of an electronic component device 2c of the second embodiment is obtained by cutting the package member 3 in FIG. 8F, and is basically constructed by stacking an upper package portion 4a on a lower package portion 4b.

In the lower package portion 4b, the Zener diodes ZD are formed on the upper surface side of the silicon substrate 20a, and the Zener diodes ZD are connected to the connection electrodes 56 via the electrode pads 52. Also, in the upper package portion 4a, the insulating layer 14 is formed on both surface sides of the silicon substrate 10a and the inner surfaces of the through holes TH provided in this substrate, and the through electrodes 18 both surface sides of which are planarized are filled in the through holes TH.

Then, the lower connection portions 18a of the through electrodes 18 in the upper package portion 4a are joined to the connection electrodes 56 on the upper surface side of the lower package portion 4b.

Then, the bumps 30a of the LED 30 are flip-chip connected to the upper connection portions 18a of the through electrodes 18 in the upper package portion 4a. Also, the LED 30 is embedded in the fluorescent substance 32, and the upper surface (the light emitting surface) of the LED 30 is covered with the fluorescent substance 32. Like the electronic component package 1 in FIG. 5 in the first embodiment, the LED 30 emits a blue or purple light, for example, and a white light is emitted to the outside by the action of the fluorescent substance 32.

Also, the LED 30 is connected to the Zener diodes ZD, which are provided in the silicon substrate 20a of the lower package portion 4b, via the through electrodes 18 of the upper package portion 4a and the connection electrodes 56 and the electrode pads 52 of the lower package portion 4b. The Zener diode ZD is connected electrically in parallel with the LED 30 in a power supply line and functions as a power supply regulator.

Figure 10:
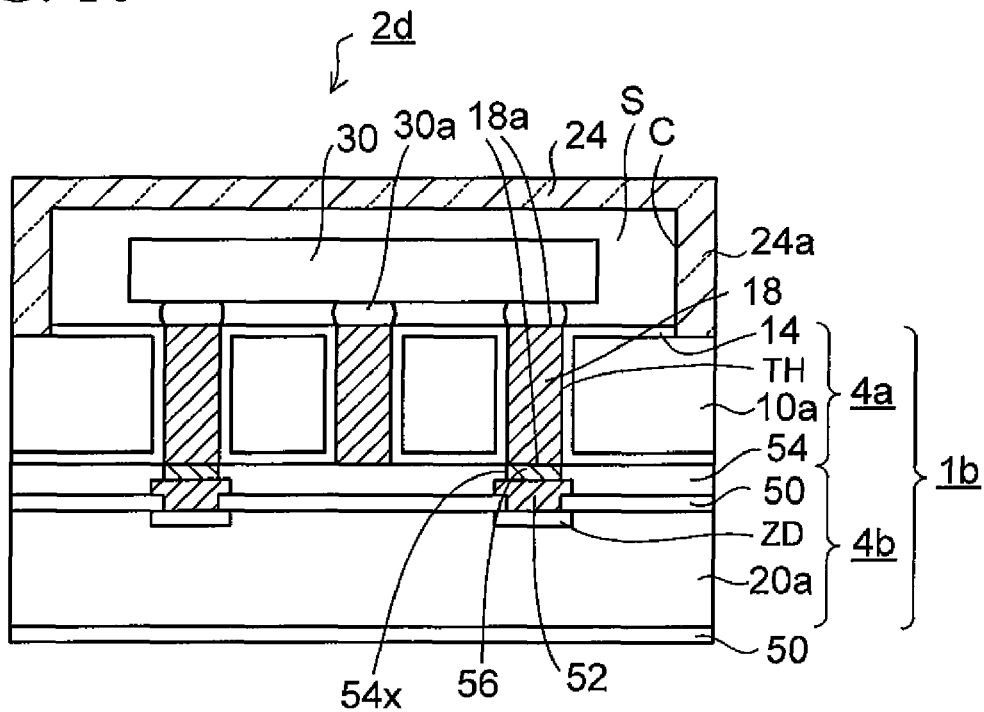
FIG. 10 is a sectional view showing an electronic component device of a variation of the second embodiment of the present invention.

In this case, like an electronic component device 2d of a variation shown in FIG. 10, the cap member 24 made of a transparent glass and having such a structure that the cavity C is provided in the center portion and the projection-like bonding portion 24a is provided on the peripheral portion, is arranged and joined onto the electronic component package 1b of the second embodiment. The insulating layer 14 on the peripheral portion of the upper package portion 4a is partially removed, and the cap member 24 is anode-connected to the silicon substrate 10a of the upper package portion 4a.

Accordingly, the LED 30 mounted on the upper package portion 4a is housed in the housing portion S constructed by the cap member 24 in a hermetically sealed condition.

Alternately, the LED 30 may be embedded in the fluorescent substance 32, and then the transparent cap member may be provided thereon.

In the second embodiment, an example where the Zener diodes ZD connected to the LED 30 are built in the silicon substrate 20a of the lower package portion 4b is illustrated. In this case, the MEMS element such as an acceleration sensor, or the like may be mounted instead of the LED 30 on the upper package portion 4a, and the semiconductor element for driving the MEMS element, or the like may be built in the silicon substrate 20a of the lower package portion 4b. That is, each of various electronic components can be mounted on the upper package portion 4a, and various elements (semiconductor element, diode, capacitor, resistor, inductor, and the like) connected to the electronic component can be built in the silicon substrate 20a of the lower package portion 4b.

When the MEMS element is mounted on the upper package portion 4a, the electronic component device 2d having the cap member 24 in FIG. 10 is employed, and then the MEMS element is hermetically sealed in the housing portion S. In such case, the opaque material such as the silicon cap, or the like in addition to the transparent glass can be employed as the cap member 24.

In the second embodiment, like the first embodiment, the through electrodes 18 provided to the upper package portion 4a can be formed at a narrow pitch and the upper and lower connection portions 18a are planarized. Therefore, the electronic component package of the present embodiment is applicable to the package in which the high-performance electronic component is mounted.

Meanwhile, an approach of omitting the lower package portion 4b by building the Zener diodes ZD in the upper package portion 4a may be considered. However, when the Zener diodes ZD are built in the upper package portion 4a, the through holes TH must be formed after the Zener diodes ZD are formed, and then the insulating layer 14 must be formed by the thermal oxidation.

For this reason, often the characteristics of the Zener diode ZD are deviated from design values particularly in the step for the thermal oxidation, and it is extremely difficult to correct such deviation by the process conditions. In addition, the Zener diodes ZD must be covered with a protection layer to prevent an adhesion of the foreign substance after these diodes are formed, or a degree of clean of the process environment must be set highly. As a result, such a problem existed that the process management becomes complicated.

In the present embodiment, in order to avoid such problem, the Zener diodes ZD are not formed in the upper package portion 4a in which the through electrodes 18 are provided, but the Zener diodes ZD are provided to the lower package portion 4b and then the Zener diodes ZD are connected to the through electrodes 18 in the upper package portion 4a by the joining method on the low-temperature side using the plasma process.

Therefore, in the present embodiment, neither a deviation of the characteristic of the Zener diode ZD should be considered, nor a degree of clean should be kept highly up to the final step. Therefore, the package in which various elements are built can be manufactured with good yield at a low cost. This is similarly true of the case where various elements are built in instead of the Zener diode ZD.

Third Embodiment

Figure 11A:
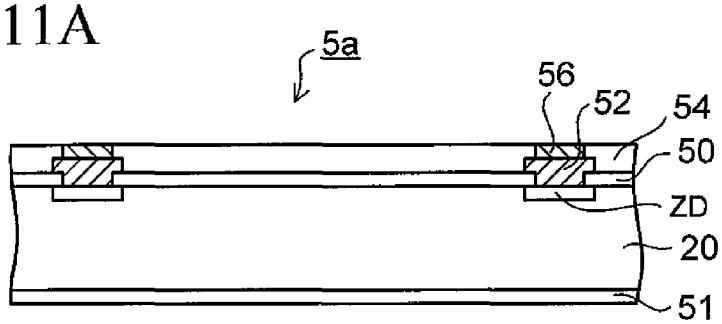
FIGS. 11A to 11D are sectional views showing a method of manufacturing an electronic component package of a third embodiment of the present invention.
Figure 11B:
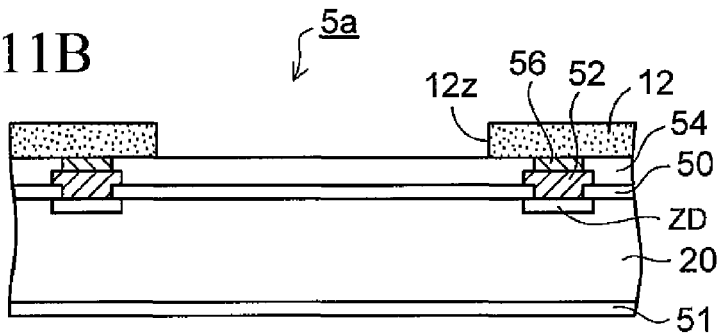
Figure 11C:
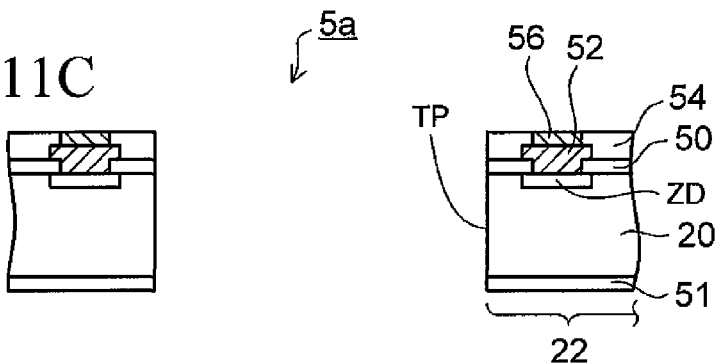
Figure 11D:
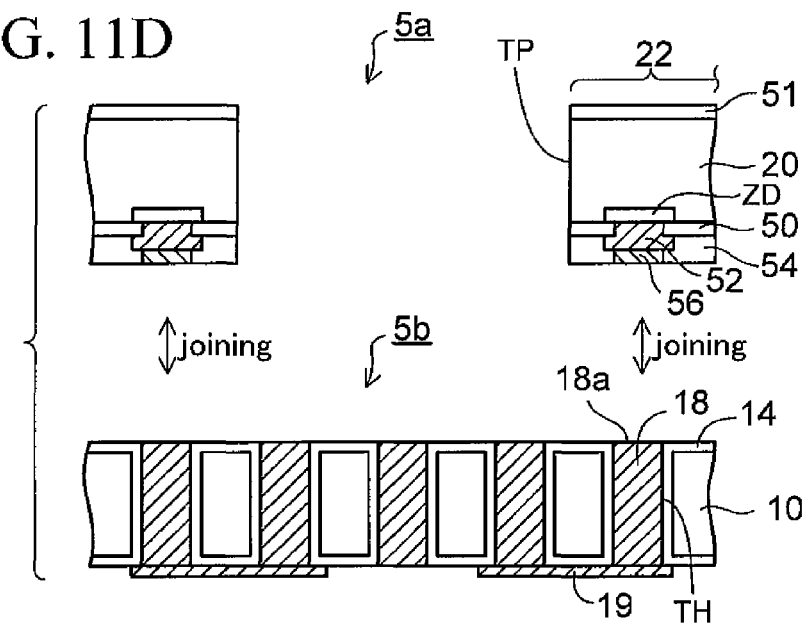
Figure 12:
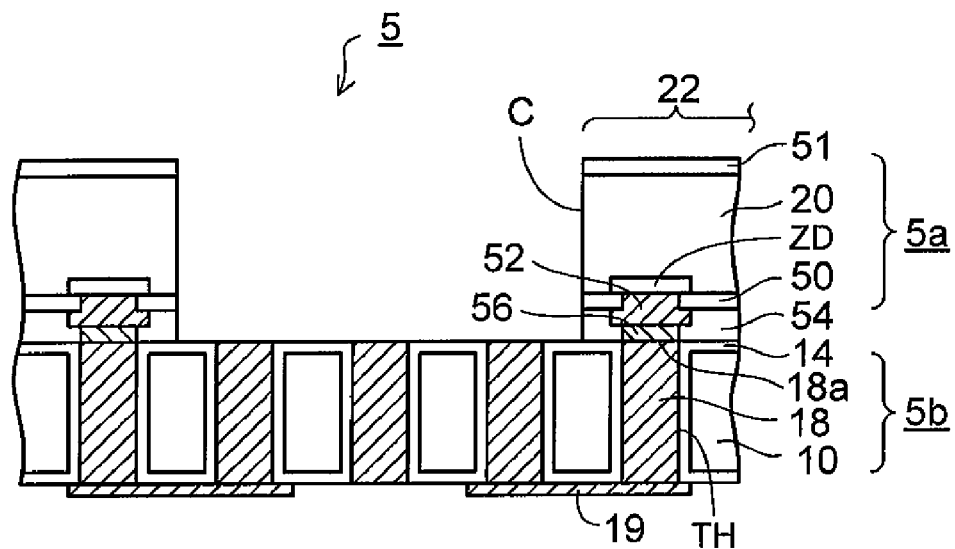
FIG. 12 is a sectional view showing an electronic component package of the third embodiment of the present invention.
Figure 13:
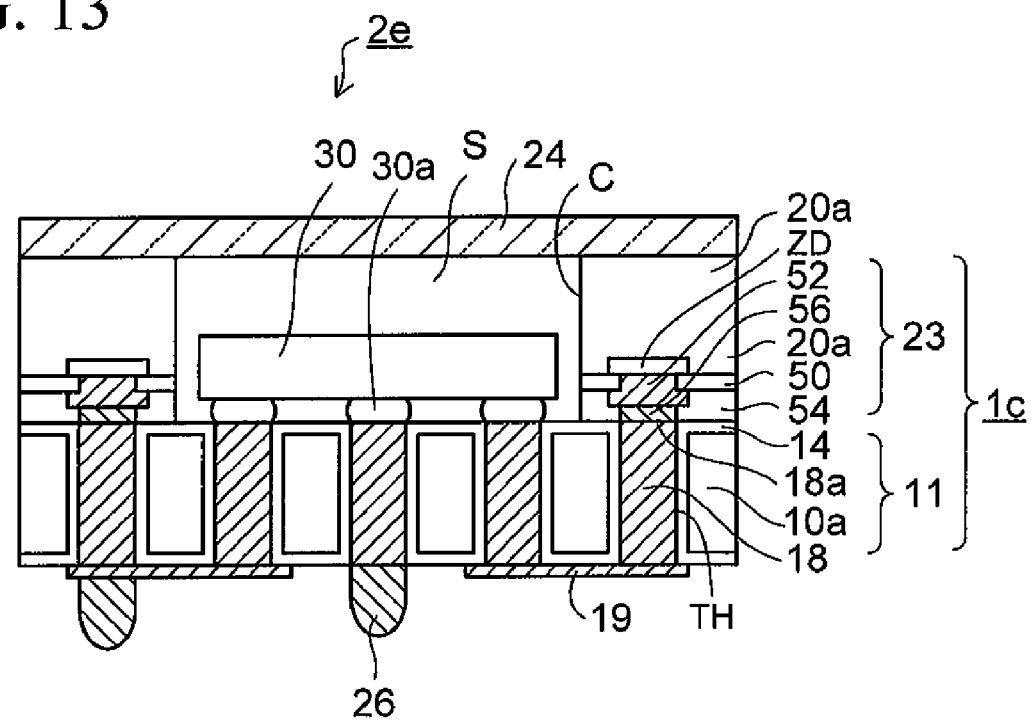
FIG. 13 is a sectional view showing an electronic component device of the third embodiment of the present invention.

FIGS. 11A to 11D are sectional views showing a method of manufacturing an electronic component package of a third embodiment of the present invention, FIG. 12 is a sectional view showing the electronic component package of the same, and FIG. 13 is a sectional view showing the electronic component device of the same.

A feature of the third embodiment resides in that, in the second embodiment, the grid-like frame portion is formed in the second silicon wafer in which the Zener diodes are formed and then this second silicon wafer is joined onto the first silicon wafer in which the through electrodes are provided, whereby the electronic component package in which the cavity is provided is manufactured. In the third embodiment, detailed explanation about the same elements and the same steps as those in the second embodiment will be omitted.

In the method of manufacturing the electronic component package of the third embodiment, as shown in FIG. 11A, first, the same structure as the lower package member 3b shown in FIG. 8D in the second embodiment is formed, and the structure constitutes an upper package member 5a. Then, as shown in FIG. 11B, the mask layer 12 in which an opening portion 12z is provided in a major center portion of each package region of the upper package member 5a is formed.

Then, as shown in FIG. 11C, respective layers from the uppermost second insulating layer 54 to the lowermost insulating layer 51 of the upper package member 5a are etched through the opening portion 12z by using the mask layer 12 as a mask, and thus the through portion TP is formed. Then, the mask layer 12 is removed. Accordingly, the grid-like frame portion 22 is formed in the silicon wafer 10, and the Zener diodes are left in the grid-like frame portion 22. In this manner, the upper package member 5a is processed to constitute the frame member.

Then, as shown in a lower figure of FIG. 11D, a silicon wafer having the same structure as the first silicon wafer 10 in the first embodiment, in which the through electrodes 18 in FIG. 2G are provided, is formed. Then, wiring pattern layers 19 for connecting predetermined through electrodes 18 mutually are formed on the lower surface side of the first silicon wafer 10. Thus, a lower package member 5b is obtained.

Then, as shown similarly in FIG. 11D, the upper package member 5a that is turned upside down from FIG. 11C is arranged on the lower package member 5b, and the connection electrodes 56 of the grid-like frame portion 22 in the upper package member 5a are joined to the connection portions 18a of the through electrodes 18 in the lower package member 5b. As the joining method, the method of utilizing the plasma process as in the first and second embodiments may be employed.

Thus, as shown in FIG. 12, the connection electrode 56 of the upper package member 5a are joined and connected electrically to the upper connection portions 18a of the through electrodes 18 in lower package member 5b. Also, the cavity C constructed by the grid-like frame portion 22 is provided in each package region of the lower package member 5b. Accordingly, a package member 5 of the third embodiment is obtained.

In the third embodiment, the electronic component may be mounted on the wafer-like package member 5, and then individual electronic component devices may be constructed by cutting the grid-like frame portion 22 and the lower package member 5b. Alternately, individual packages may be obtained by cutting the grid-like frame portion 22 and the lower package member 5b, and then the electronic component devices may be constructed by mounting the electronic component respectively.

In FIG. 13, an electronic component device constructed by using the electronic component package of the third embodiment is shown. As shown in FIG. 13, an electronic component package 1c of an electronic component device 2e of the third embodiment is obtained by cutting the above package member 5 in FIG. 12, and is basically constructed by the package substrate portion 11 and the frame portion 23 provided upright on the peripheral portion.

In the package substrate portion 11, like the first embodiment, the through holes TH are provided in the silicon substrate 10a, and the insulating layer 14 is formed on both surface sides of the silicon substrate 10a and the inner surfaces of the through holes TH. The through electrodes 18 are provided in the through holes TH, and the upper surfaces and the lower surface of the through electrodes 18 are planarized at the same height as the upper surface and the lower surface of the insulating layer 14 on the silicon substrate 10a respectively.

Also, the frame portion 23 is joined to the peripheral portion on the package substrate portion 11, and thus the cavity C is provided in the center major portion on the silicon substrate 10a. The Zener diodes are formed in the lower surface side of the silicon portion 20a of the frame portion 23, and the connection electrodes 56 connected to the Zener diodes are joined to the upper connection portions 18a of the through electrodes 18 of the package substrate portion 11.

Also, the wiring pattern layers 19 for connecting the through electrodes 18 mutually are provided on the lower surface side of the silicon substrate 10a of the package substrate portion 11.

Then, the bumps 30a of the LED 30 are flip-chip connected to the upper connection portions 18a of the through electrodes 18 of the package substrate portion 11. Also, the cap member 24 is joined to the frame portion 23, and the LED 30 is housed in the housing portion S in a hermetically sealed condition. Also, the external connection terminal 26 connected to the through electrodes 18 are provided on the lower surface of the package substrate portion 11.

In an example in FIG. 13, the cap member 24 is formed of a transparent glass cap, the insulating layer 51 on the upper surface of the frame portion 23 is removed at a predetermined stage, and the cap member 24 (the glass cap) is anode-connected to the silicon portion 20*a*. Otherwise, like the first electronic component device 2 (FIG. 5) in the first embodiment, the cap member 24 may be omitted and then the LED 30 may be embedded in the fluorescent substance. Alternately, the LED 30 may be embedded in the fluorescent substance and then the transparent cap member may be further provided thereon.

The LED 30 is connected to the Zener diodes ZD in the frame portion 23 via the through electrodes 18 to which the bumps 30*a* are connected, the wiring pattern layers 19 formed on the lower surface and connected to the electrodes, other through electrodes 18 connected to the layers, and others.

In this case, the wiring pattern layers 19 for connecting the through electrodes 18 mutually may be formed on the upper surface side of the package substrate portion 11.

The third embodiment can achieve the similar advantages to those of the second embodiment. In addition, in the third embodiment, the frame portion 23 in which the Zener diodes ZD are provided is joined onto the package substrate portion 11 in which the through electrodes 18 having the good coplanarity are provided. Therefore, the electronic component package 1*c* to which the cavity C is provided and in which the Zener diodes ZD are built can be manufactured easily. As a result, the LED 30 can be hermetically sealed in the housing portion S by the cap member 24 in a condition that such LED 30 is connected to the through electrodes 18 in the cavity C and the Zener diodes ZD in the frame portion 23 with good reliability.

In this case, in the third embodiment, the MEMS element, another optical semiconductor element, or the like may be mounted in place of the LED 30. When the MEMS element is mounted, the cap member 24 may be formed of the opaque material such as the silicon cap, or the like.

What is claimed is:

1. An electronic component package, comprising:
a package substrate portion constructed by a first silicon substrate in which a through hole is provided,
an insulating layer formed on upper and lower surfaces of the first silicon substrate and inner surface of the through hole, and a through electrode filled in the through hole; and
a frame portion formed from a second silicon substrate, and stacked on top of a peripheral portion of the package substrate portion to constitute a cavity on the first silicon substrate, the frame portion whose center part is an opening, the opening which penetrates an upper surface to a lower surface of the frame portion;
wherein, the through electrode is positioned in the opening, and an upper surface of the through electrode in the cavity is planarized such that a height of the through electrode is set equal to a height of the insulating layer, and the insulating layer formed on the upper surface of the first silicon substrate is directly in contact with the upper surface of the first silicon substrate and is disposed directly below the entire frame portion.

2. An electronic component device, comprising:
an electronic component package set forth in claim 1; and
an electronic component connected to an upper connection portion of the through electrodes.

3. An electronic component device according to claim 2, wherein a cap member used to hermetically seal the electronic component is provided on the electronic component package.

4. An electronic component device according to claim 2, wherein the electronic component is an LED, and the LED is coated with a fluorescent substance.

5. An electronic component package according to claim 1, wherein respective joining surfaces of the first silicon substrate and the second substrate are hydrophilized.

6. An electronic component package comprising:
a package substrate portion constructed by a silicon substrate in which a through hole is provided,
an insulating layer formed on both surface sides of the silicon substrate and inner surface of the through hole, and a through electrode filled in the through hole; and
a frame portion provided upright on a peripheral portion of the package substrate portion to constitute a cavity on the silicon substrate;
wherein an upper surface of the through electrode in the cavity is planarized such that a height of the through electrode is set equal to a height of the insulating layer, wherein
the frame portion includes a silicon portion, an element formed on a lower surface side of the silicon portion, and a connection electrode formed under the element and connected electrically to the element, wherein the element is any one of a diode, a semiconductor element, a capacitor, a resistor, and an inductor, and
the connection electrode of the frame portion is joined to the through electrode of the package substrate portion.

7. An electronic component package, comprising:
an upper package portion constructed by a first silicon substrate in which a through hole is provided,
an insulating layer formed on both surface sides of the first silicon substrate and inner surface of the through hole, and a through electrode filled in the through hole and planarized such that a height of the through electrode is set equal to a height of the insulating layer; and
a lower package portion constructed by a second silicon portion, an element formed on an upper surface side of the second silicon portion, and a connection electrode formed on the element and connected electrically to the element,
wherein the element is any one of a diode, a semiconductor element, a capacitor, a resistor, and an inductor, and
wherein the upper package portion is stacked and arranged on the lower package portion, and a lower surface of the through electrode of the upper package portion is joined to the connection electrode of the lower package portion.

8. An electronic component device, comprising:
an electronic component package set forth in any one of claims 6 to 7; and
an electronic component connected to an upper connection portion of the through electrodes.

9. An electronic component device according to claim 8, wherein a cap member used to hermetically seal the electronic component is provided on the electronic component package.

10. An electronic component device according to claim 8, wherein the electronic component is an LED, and the LED is coated with a fluorescent substance.

* * * * *